(12) United States Patent
Chao et al.

(10) Patent No.: US 8,571,229 B2
(45) Date of Patent: Oct. 29, 2013

(54) SEMICONDUCTOR DEVICE

(75) Inventors: Chien-Sheng Chao, Hsinchu (TW);
Tse-Chi Lin, Taipei County (TW);
Yin-Chao Huang, Taipei Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 612 days.

(21) Appl. No.: 12/477,126

(22) Filed: Jun. 3, 2009

(65) Prior Publication Data

US 2010/0308447 A1 Dec. 9, 2010

(51) Int. Cl.
*H04B 3/00* (2006.01)

(52) U.S. Cl.
USPC ............. 381/80; 257/665; 257/666; 257/676; 257/690; 257/692; 257/734; 257/773; 257/784; 257/786; 257/E23.01; 257/E23.012; 257/E23.014; 257/E23.015; 257/E23.023; 257/E23.024; 257/E23.031; 257/E23.032; 257/E23.033; 257/E23.043; 257/E23.079

(58) Field of Classification Search
None
See application file for complete search history.

(56) References Cited

U.S. PATENT DOCUMENTS 4,244,040 A * 1/1981 Fondiller et al. ................. 368/69
4,848,877 A * 7/1989 Miller ........................... 349/184
6,809,405 B2 * 10/2004 Ito et al. ........................ 257/666
2002/0003206 A1 * 1/2002 Culver ........................... 250/221
2002/0173070 A1 * 11/2002 Bolken et al. ................. 438/106
2003/0047409 A1 * 3/2003 Fliege ...................... 192/85 CA
2007/0126094 A1 * 6/2007 Shojaie et al. ................ 257/676
2010/0193803 A1 * 8/2010 Liu et al. ......................... 257/81

FOREIGN PATENT DOCUMENTS

JP 11297871 A 10/1999
TW 200428614 12/2004
TW 200524120 7/2005

* cited by examiner

*Primary Examiner* — Fei Fei Yeung Lopez
(74) *Attorney, Agent, or Firm* — Winston Hsu; Scott Margo (57) ABSTRACT

A semiconductor device includes at least a die carried by a substrate, a plurality of bond pads disposed on the die, a plurality of conductive components, and a plurality of bond wires respectively connected between the plurality of bond pads and the plurality of conductive components. The plurality of bond pads respectively correspond to a plurality of signals, and include a first bond pad configured for transmitting/receiving a first signal and a second bond pad configured for transmitting/receiving a second signal. The plurality of conductive components include a first conductive component and a second conductive component. The first conductive component is bond-wired to the first bond pad, and the second conductive component is bond-wired to the second bond pad. The first conductive component and the second conductive component are separated by at least a third conductive component of the plurality of conductive components, and the first signal is asserted when the second signal is asserted.

18 Claims, 8 Drawing Sheets

SEMICONDUCTOR DEVICE

BACKGROUND

The present invention relates to a semiconductor device, and more particularly, to a semiconductor device in which first and second conductive components for respectively transmitting/receiving first and second signals are separated by at least a conductive component, wherein the first signal is asserted when the second signal is asserted.

For a large scale integrated circuit such as a large scale system on a chip (SOC), in order to reduce costs of exterior circuit component(s), there is a trend of integrating the exterior circuit component(s) into the large scale SOC. For example, a multi-channel audio codec component can be integrated into a large scale SOC so as to minimize the costs. However, the large scale SOC needs a higher number of signal ports, for transmitting/receiving more signals. Due to the higher number of signal ports, the large scale SOC is usually encapsulated in the Low profile Quad Flat Package (LQFP), the Ball Grid Array (BGA) package, or other types of packages suitable for large scale circuits. An example of the LQFP is illustrated in FIG. 1A.

Figure 1A:
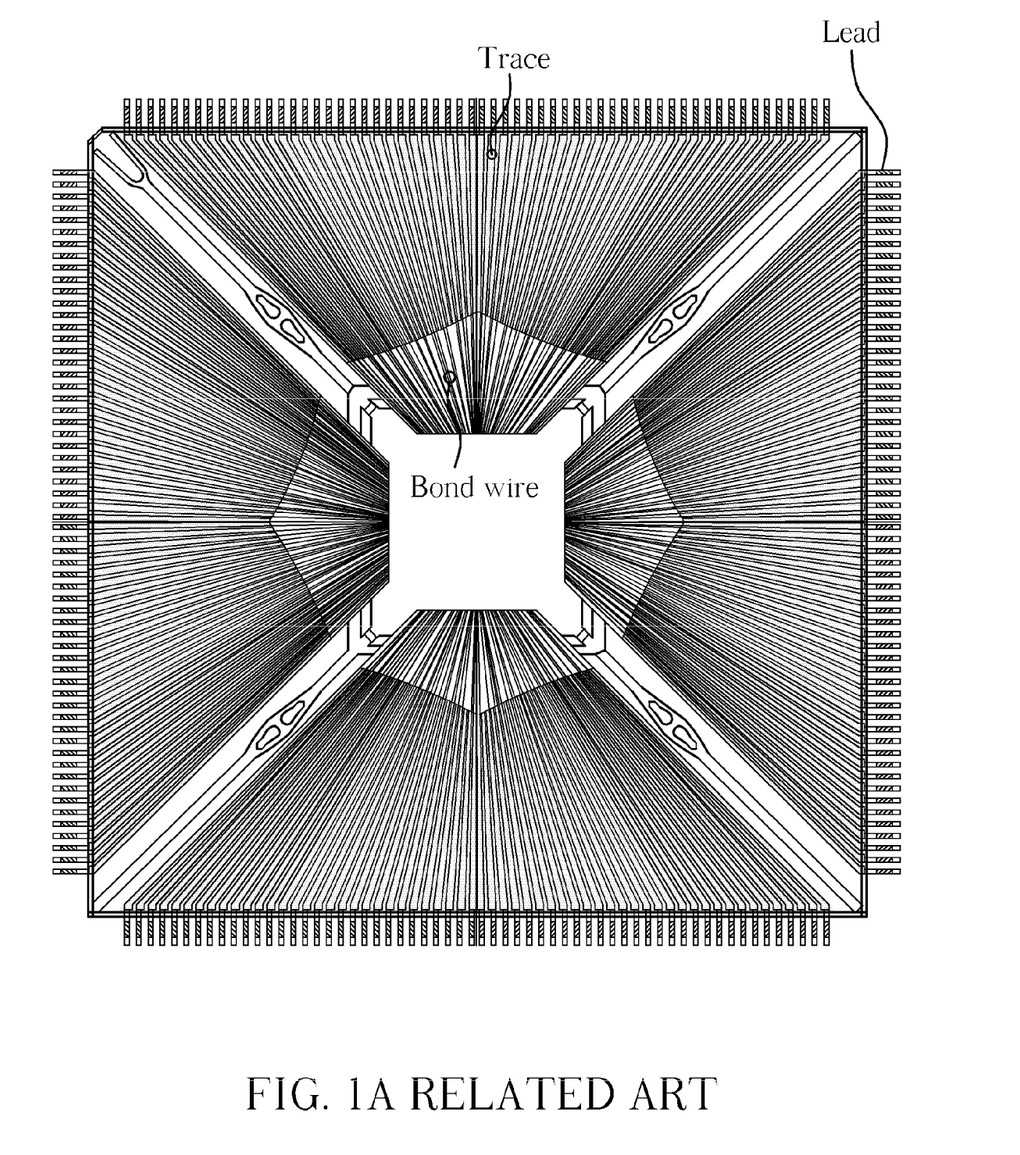
FIG. 1A is a diagram showing a large scale integrated circuit encapsulated within an LQFP.
Figure 1B:
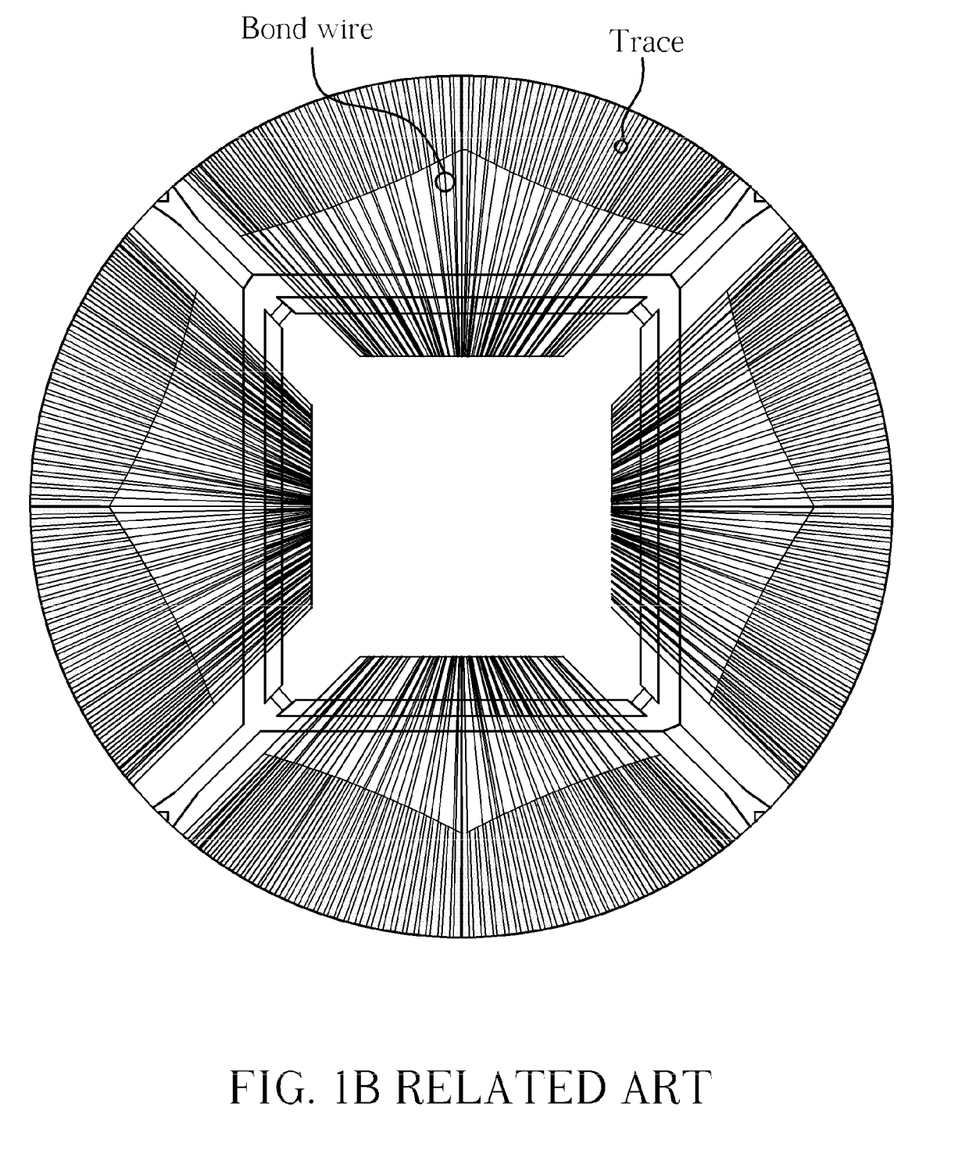
FIG. 1B is a partial enlarged view showing the traces, bond wires, and the bond pads of FIG. 1A.

In order to accommodate more pins or more solder balls, it is necessary to reduce space between two neighboring leads or traces; as shown in FIG. 1A, one of two neighboring leads/traces is quite near to each other. FIG. 1B is a partial enlarged view showing the traces, bond wires, and the bond pads of FIG. 1A. However, reducing the space between the neighboring leads/traces incurs increased stray capacitances. As a result of the increased stray capacitances, the undesired capacitive, inductive, or conductive coupling from a signal line will interfere with a corresponding neighboring signal line; this is the so-called crosstalk effect. Especially for audio processing, the crosstalk effect is an important problem for which a solution is urgently required.

SUMMARY

It is therefore one of the objectives of the present invention to provide a semiconductor device capable of reducing the crosstalk effect between two adjacent signal lines while a large pin/solder ball count is available, to solve the above-mentioned problem.

According to an embodiment of the claimed invention, a semiconductor device is disclosed. The semiconductor device comprises at least a die carried by a substrate, a plurality of bond pads disposed on the die, a plurality of conductive components arranged on the substrate, and a plurality of bond wires respectively connected between the plurality of bond pads and the plurality of conductive components. The plurality of bond pads respectively correspond to a plurality of signals, and comprise a first bond pad configured for transmitting/receiving a first signal and a second bond pad configured for transmitting/receiving a second signal. The plurality of conductive components comprise a first conductive component and a second conductive component. The first conductive component is bond-wired to the first bond pad, and the second conductive component is bond-wired to the second bond pad. The first conductive component and the second conductive component are separated by at least a third conductive component of the plurality of conductive components, and the first signal is asserted when the second signal is asserted.

According to another embodiment of the claimed invention, a semiconductor device is disclosed. The semiconductor device comprises at least a die carried by a substrate, and a plurality of bond pads disposed on the die. The plurality of bond pads respectively correspond to a plurality of signals, and comprise a first bond pad configured for transmitting/receiving a first signal and a second bond pad configured for transmitting/receiving a second signal. The first bond pad and the second bond pad are separated by at least a third bond pad of the plurality of bond pads, and the first signal is asserted when the second signal is asserted.

According to another embodiment of the claimed invention, a semiconductor device is disclosed. The semiconductor device comprises at least a die carried by a substrate, and a plurality of conductive components, respectively corresponding to a plurality of signals. The plurality of conductive components comprise a first conductive component configured for transmitting/receiving a first signal and a second conductive component configured for transmitting/receiving a second signal; wherein the first conductive component and the second conductive component are separated by at least a third conductive component of the plurality of conductive components, and the first signal is asserted when the second signal is asserted.

One of the advantages of the above embodiment is that increasing the space between any two conductive components (or any two bond pads) corresponding to left and right channel signals of the same multi-channel stereo signal can effectively decrease the stray capacitances introduced between the conductive components (or the bond pads) so as to reduce the crosstalk effect.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
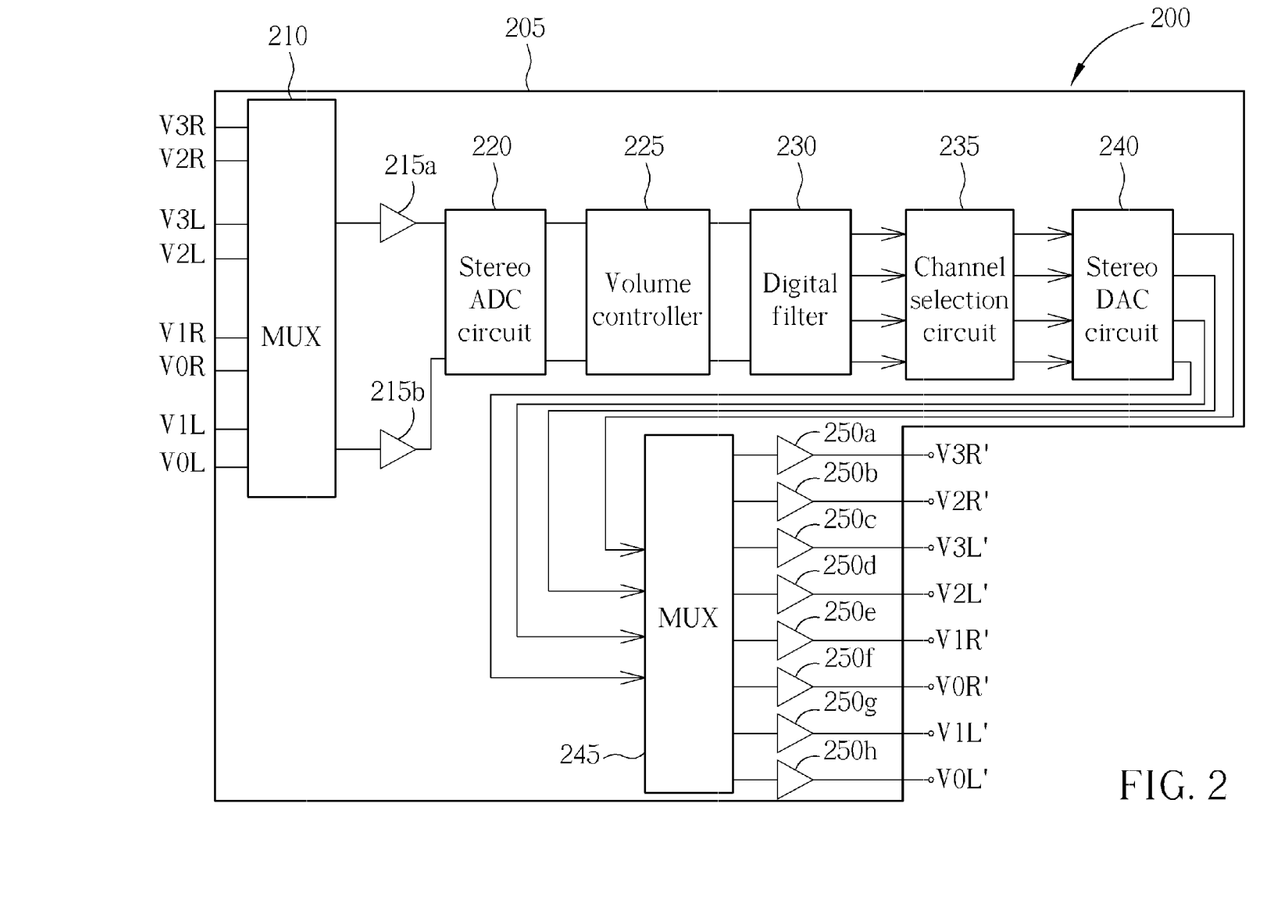
FIG. 2 is a diagram of an audio processing component integrated into a semiconductor device such as a large scale SOC according to an embodiment of the present invention.

Please refer to FIG. 2, which illustrates a diagram of an audio processing component 205 integrated into a semiconductor device 200 such as a large scale SOC according to an embodiment of the present invention. In this embodiment, the large scale SOC 200 is encapsulated within an LQFP; the audio processing component 205 may include but is not limited to a multiplexer (MUX) 210, a plurality of buffers 215a and 215b, a stereo ADC circuit 220, a volume controller 225, a digital filter 230, a channel selection circuit 235, a stereo DAC (digital-to-analog) circuit 240, a MUX 245, a plurality of buffers 250a~205h, and other audio processing circuits not shown in FIG. 2. The audio processing component 205 transmits/receives four multi-channel stereo signals, each having a corresponding left channel signal and a corresponding right channel signal, as shown in FIG. 2. For example, a multi-channel stereo signal can be composed of a left channel signal V0L and a right channel signal V0R, which are received by the audio processing component 205. In another example, a multi-channel stereo signal can be composed of a left channel signal V0L' and a right channel signal V0R', which are transmitted/outputted by the audio processing component 205. That is, the mentioned multi-channel stereo signals can be signals inputted into or outputted from the audio processing component 205.

For the purpose of reducing the crosstalk effect, each pin for transmitting/receiving a left channel signal (e.g. V0L' or V0L) and a corresponding pin for transmitting/receiving a right channel signal (e.g. V0R' or V0R) thereof are designed to be separated by at least a third pin. For example, the pins corresponding to the channel signals V0L and V0R are separated by the pin corresponding to the left channel signal V1L; however, this is not intended to be a limitation of the present invention. In another embodiment, the pins corresponding to a set of left and right channel signals can be designed to be separated by a plurality of signal pins, to reduce the crosstalk effect.

Figure 3:
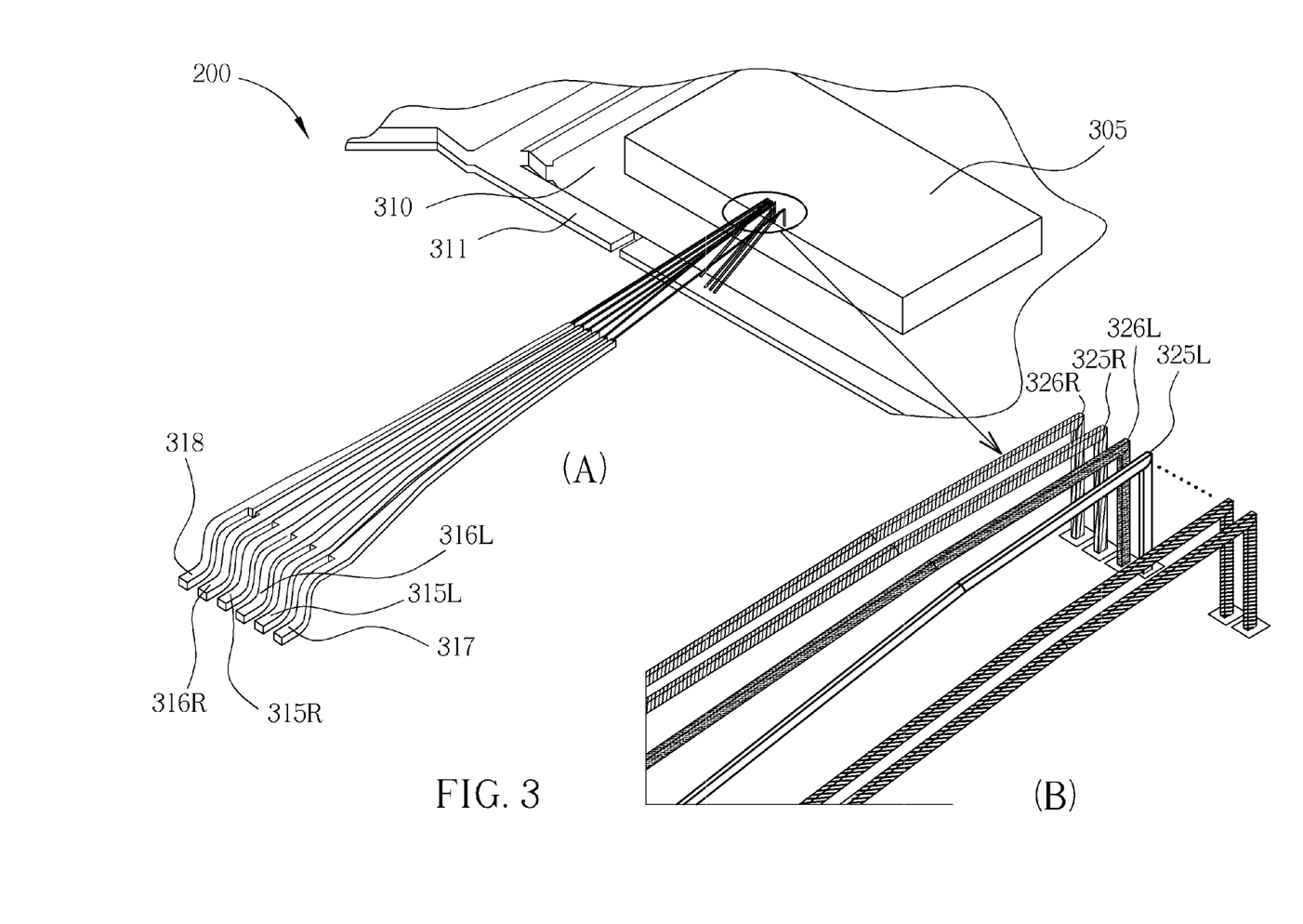
FIG. 3 is a diagram of the first integrated circuit package structure of the semiconductor device shown in FIG. 2.

In practice, for achieving separation of one of signal ports corresponding to the left and right channel signals from one another, in the example of LQFP, conductive components (e.g. lead frames) corresponding to the left and right channel signals are separated by at least another conductive component. Please refer to FIG. 3. FIG. 3 is a diagram of a first integrated circuit package structure of the semiconductor device 200 shown in FIG. 2. As shown in part (A) of FIG. 3, the semiconductor device 200 comprises at least a die 305 which is stalled on the exposed pad (E-pad) 310, carried by a substrate 311, and corresponding to the audio processing component 205. In addition, the semiconductor device 200 further comprises a plurality of bond pads disposed on the die 305, a plurality of conductive components 315L, 315R, 316L, 316R, 317, and 318 arranged above the substrate, and a plurality of bond wires respectively connected between the bond pads and the conductive components 315L, 315R, 316L, 316R, 317, and 318. The conductive components 315L and 316L correspond to different left channel signals, and the conductive components 315R and 316R correspond to different right channel signals. The conductive components 315L and 315R correspond to a multi-channel stereo signal while the conductive components 316L and 316R correspond to another multi-channel stereo signal. One of the conductive components 317 and 318 corresponds to a supply level (such as a power supply voltage VDD, a common voltage Vcm, or any substantially fixed voltage level), and another one corresponds to a ground level. It should be noted that the number of the conductive components shown in part (A) of FIG. 3 are only utilized for illustrative purposes, and are not meant to be limitations of the present invention. Other conductive components not shown in part (A) of FIG. 3 are omitted for brevity.

A first bond pad (not shown in part (A) of FIG. 3) is configured for transmitting/receiving a first signal such as a left channel signal corresponding to a first conductive component (e.g. 315L), and a second bond pad (not shown in part (A) of FIG. 3) is configured for transmitting/receiving a second signal such as a right channel signal corresponding to a second conductive component (e.g. 315R). The first and second conductive components are bond-wired to the first and second bond pads, respectively. Particularly, all the bond pads and bond wires are used for electrically connecting the audio processing component 205 to the conductive components 315L, 315R, 316L, 316R, 317, and 318. Thus, after fabrication, the packaged die 305 can communicate with circuitry external to the semiconductor device 200 though the conductive components 315L, 315R, 316L, 316R, 317, and 318 embedded in the semiconductor device 200.

In this embodiment, the conductive components 315L and 315R respectively corresponding to left and right channel signals such as V0L and V0R belonging to the same multi-channel stereo signal are separated by the conductive component 316L, which corresponds to a left channel signal V1L belonging to another multi-channel stereo signal. In addition, the conductive components 316L and 316R respectively corresponding to left and right channel signals such as V1L and V1R belonging to the same multi-channel stereo signal are separated by the conductive component 315R, which corresponds to the right channel signal V0R belonging to another multi-channel stereo signal. That is, a conductive component corresponding to a left/right channel signal is disposed between conductive components corresponding to two channel signals belonging to the same multi-channel stereo signal. Due to this, the crosstalk effect between the left and right channel signals (e.g. V0L and V0R, or V1L and V1R) can be reduced significantly because the conductive component disposed between the left and right channel signals provides a shielding function. It should be noted that the audio processing component 205 receives only one of the four multi-channel stereo signals each time. When the audio processing component 205 processes a multi-channel stereo signal, signal ports corresponding to the other multi-channel stereo signals, or signal ports disposed between the two ports corresponding to the processed multi-channel stereo signal, can be connected to a ground level, a supply level (such as a power supply voltage level VDD or a common voltage level Vcm), or any substantially fixed voltage level. That is, when one of left and right channel signals belonging to the same multi-channel stereo signal is asserted, another one is also asserted; however, left/right channel signals belonging to the other multi-channel stereo signals are not asserted. In the other words, the left and right channel signals V0L and V0R are not affected by the left channel signal V1L or other channel signals.

Part (B) of FIG. 3 is a partial enlarged view showing the bond pads and bond wires of part (A) of FIG. 3. As shown in part (B) of FIG. 3, the bond pads on the die 305 (not shown in part (B) of FIG. 3) are arranged in one tier along the edge of the die 305. The bond wires 325L and 325R, which are respectively coupled to the conductive components 315L and 315R, are separated by the bond wire 326L that is directly coupled to the conductive component 316L. In addition, the bond wires 326L and 326R, which are respectively coupled to the conductive components 316L and 316R, are separated by the bond wire 325R that is directly coupled to the conductive component 315R. That is to say, the bond wires corresponding to the same set of left and right channel signals are separated by a bond wire corresponding to another left/right channel signal. The conductive components corresponding to the same set of left and right channel signals are separated by a conductive component corresponding to another left/right channel signal, and the bond pads corresponding to the same set of left and right channel signals are separated by a bond pad corresponding to another left/right channel signal, as well.

Figure 4:
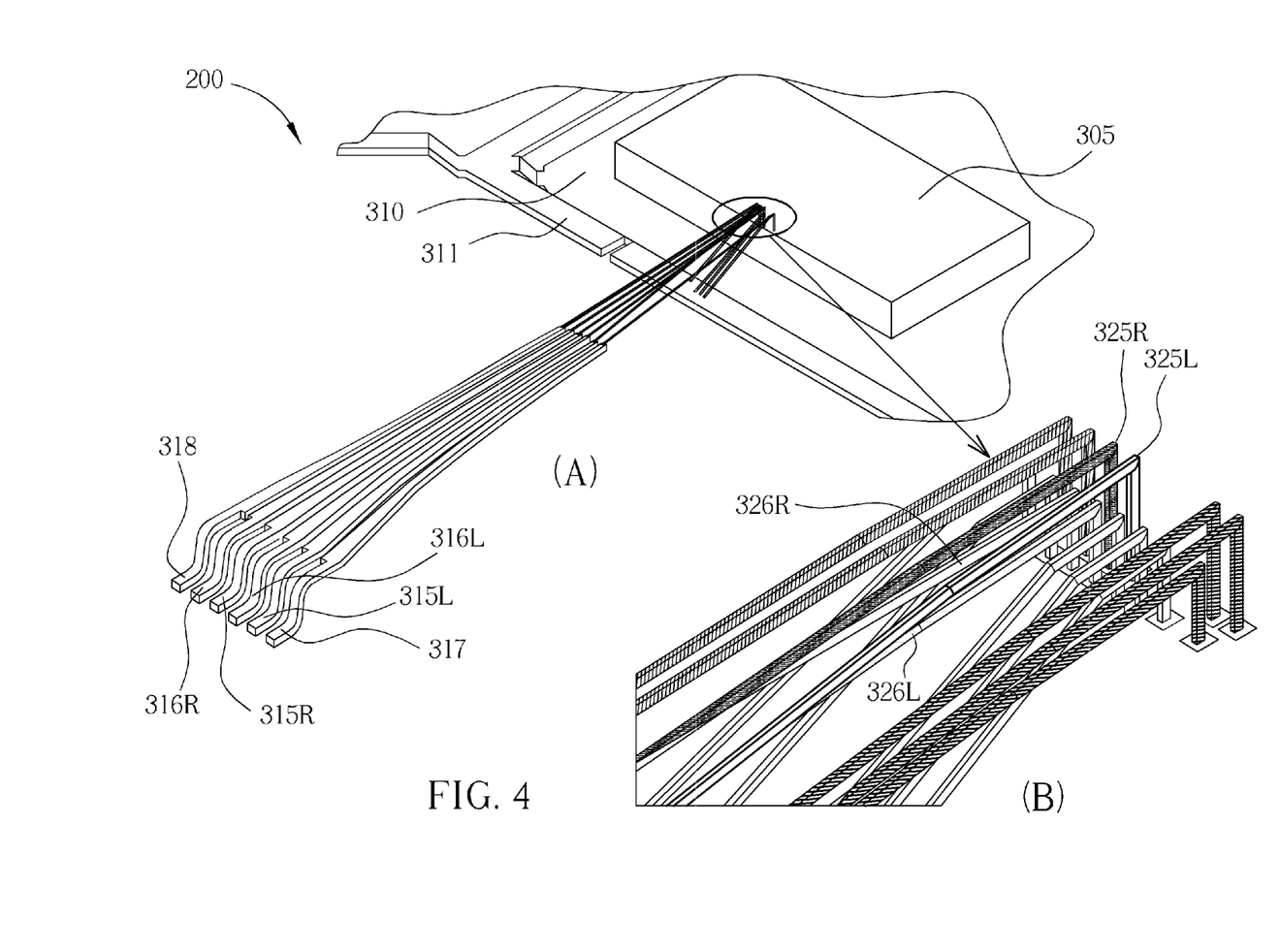
FIG. 4 is a diagram of the second integrated circuit package structure of the semiconductor device shown in FIG. 2.

In other embodiments, the bond pads disposed on the die 305 can also be arranged in a plurality tiers such as two tiers. Please refer to FIG. 4. FIG. 4 is a diagram of a second integrated circuit package structure of the semiconductor device 200 shown in FIG. 2. The bond pads relatively close to the core of the die 305 are called inner bond pads, and the other bond pads in a tier are referred as to outer bond pads. In this embodiment, the bond wires 325L and 325R respectively coupled to the conductive components 315L and 315R connect to the bond pads arranged in the same tier, i.e., inner bond pads. The bond wires 326L and 326R respectively coupled to the conductive components 316L and 316R connect to the bond pads arranged in the same tier, i.e., outer bond pads. That is, the bond wires 325L and 325R corresponding to the left and right channel signals V0L and V0R are not separated by another bond wire. However, the crosstalk effect between the left and right channel signals V0L and V0R dose not increase too much since the length of each conductive component is considerably longer than that of each bond wire.

Figure 5:
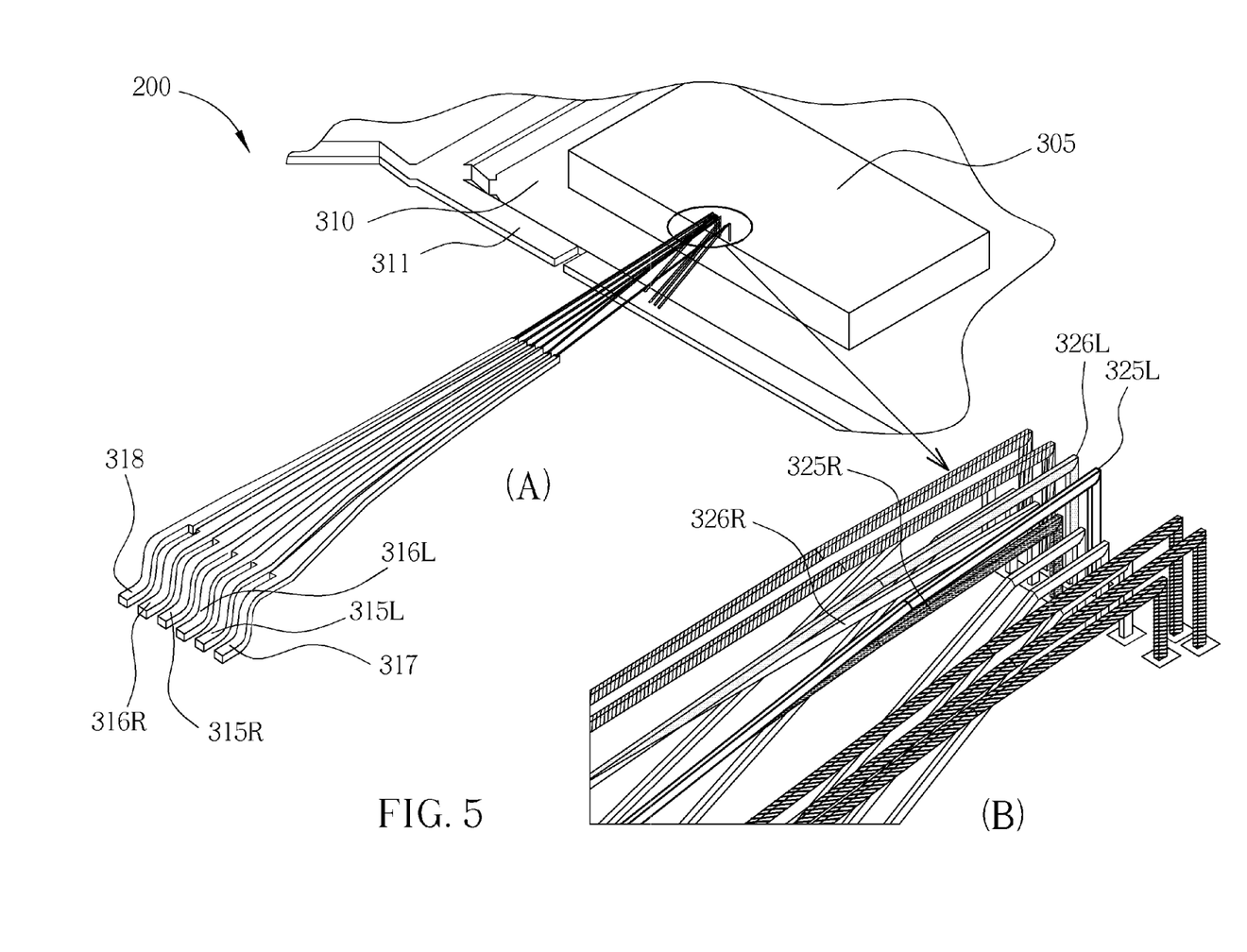
FIG. 5 is a diagram of the third integrated circuit package structure of the semiconductor device shown in FIG. 2.

In another embodiment, bond wires, which respectively correspond to left and right channel signals belonging to the same multi-channel stereo signal, can be arranged to be separated by one or more bond wires corresponding to other signals. Please refer to FIG. 5. Part (A) of FIG. 5 shows a diagram of a third integrated circuit package structure of the semiconductor device 200 shown in FIG. 2. Part (B) of FIG. 5 is a partial enlarged view showing the bond pads and bond wires of part (A) of FIG. 5. Similarly, the conductive components 315L and 315R corresponding to the left and right channel signals V0L and V0R belonging to the same of multi-channel stereo signal are separated by the conductive component 316L. The conductive components 316L and 316R corresponding to the left and right channel signals V1L and V1R belonging to the same of multi-channel stereo signal are separated by the conductive component 315R. Thus, the crosstalk effect between the left and right channel signals V0L and V0R (or V1L and V1R) is significantly reduced. A difference is that the bond wires 325L and 325R corresponding to the left and right channel signals V0L and V0R are arranged to connect the bond pads located at different tiers. More particularly, the bond wire 325L is coupled to an inner bond pad, and the bond wire 325R is coupled to an outer bond pad. The bond wire 326L is coupled to an inner bond pad, and the bond wire 326R is coupled to an outer bond pad. That is, the bond wires 325L and 325R are not located at the same height, and the bond wires 326L and 326R are also not located at the same height. In other words, the bond wire 325L may cross above the bond wire 325R, and the bond wire 326L may cross above the bond wire 326R, as shown in part (B) of FIG. 5.

Note that the above-mentioned arrangements of the bond wires and bond pads are not intended to be limitations of the present invention. Other modifications of the configuration of the bond wires and bond pads for the purpose of reducing the crosstalk effect also fall within the scope of the present invention.

Figure 6:
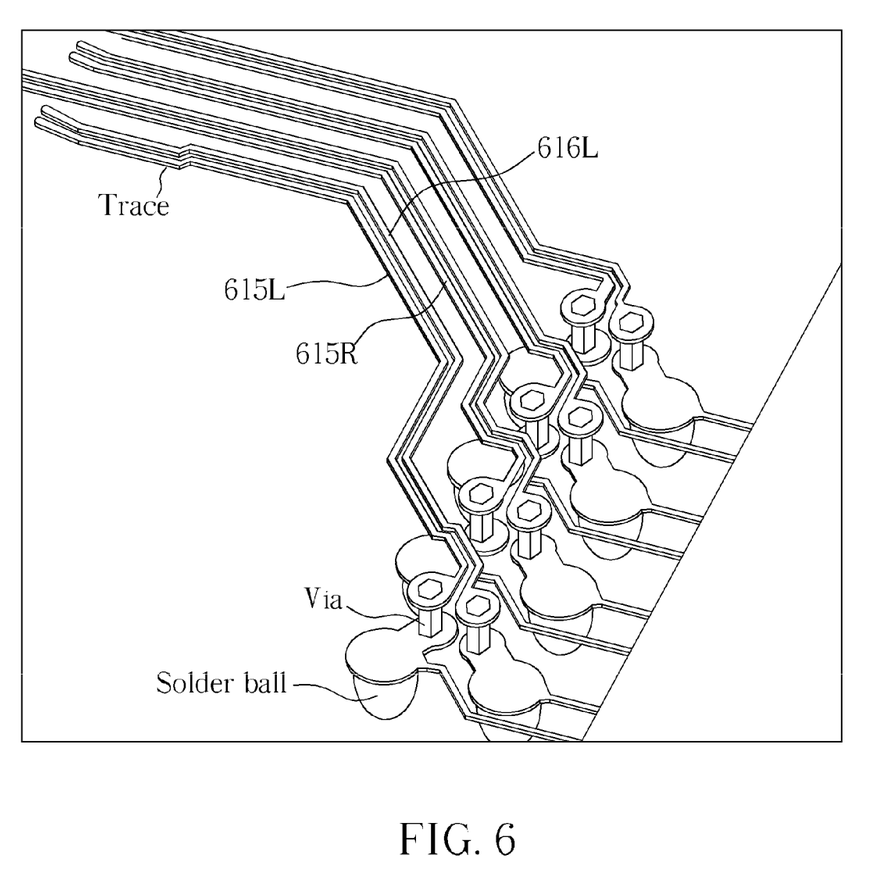
FIG. 6 is a diagram showing the fourth integrated circuit package structure of the semiconductor device shown in FIG. 2.

In addition, the arrangements of the signal lines shown in FIG. 3-FIG. 5 and involved modifications thereof can be applied to other kinds of integrated circuit packages such as the BGA package. Please refer to FIG. 6, in an embodiment with the BGA package, conductive components (e.g. traces, or so-called fingers) 615L and 615R corresponding to left and right channel signals belonging to the same multi-channel stereo signal are separated by at least one conductive component (e.g. 616L) corresponding to another multi-channel stereo signal or other signals. All the conductive components are coupled to vias and solder balls, and are bond-wired to a die. In other embodiments such as flip chip packages, however, the bond wires are omitted, and the conductive components are coupled to the die through solder bumps. Since the description directed to the arrangement of the traces is similar to that pertinent to the lead frames shown in FIG. 3-FIG. 5, detailed description is omitted for the sake of brevity. Note that the positions of solder balls respectively corresponding to the left and right channel signals belonging to the same multi-channel stereo signal can be disposed near to each other or be separated by another solder ball corresponding to another channel signal or other signals. In other words, any modifications of the arrangement for the traces or the positions of solder balls all obey the spirit of the present invention.

Furthermore, the above-described embodiments are not limited to the field of audio processing. That is, for reduction of the crosstalk effect in a semiconductor device, separating a first conductive component (lead frames, traces, or other electrically connecting means) from a second conductive component by at least a third conductive component also obeys the spirit of the present invention, wherein a third signal corresponding to the third conductive component is not asserted when first and second signals corresponding to the first and second signals are asserted. The third signal may have a substantially fixed voltage level (e.g. supply voltage level, common voltage level or ground voltage level) when the first and second signals are asserted to enhance the shielding effect.

Figure 7:
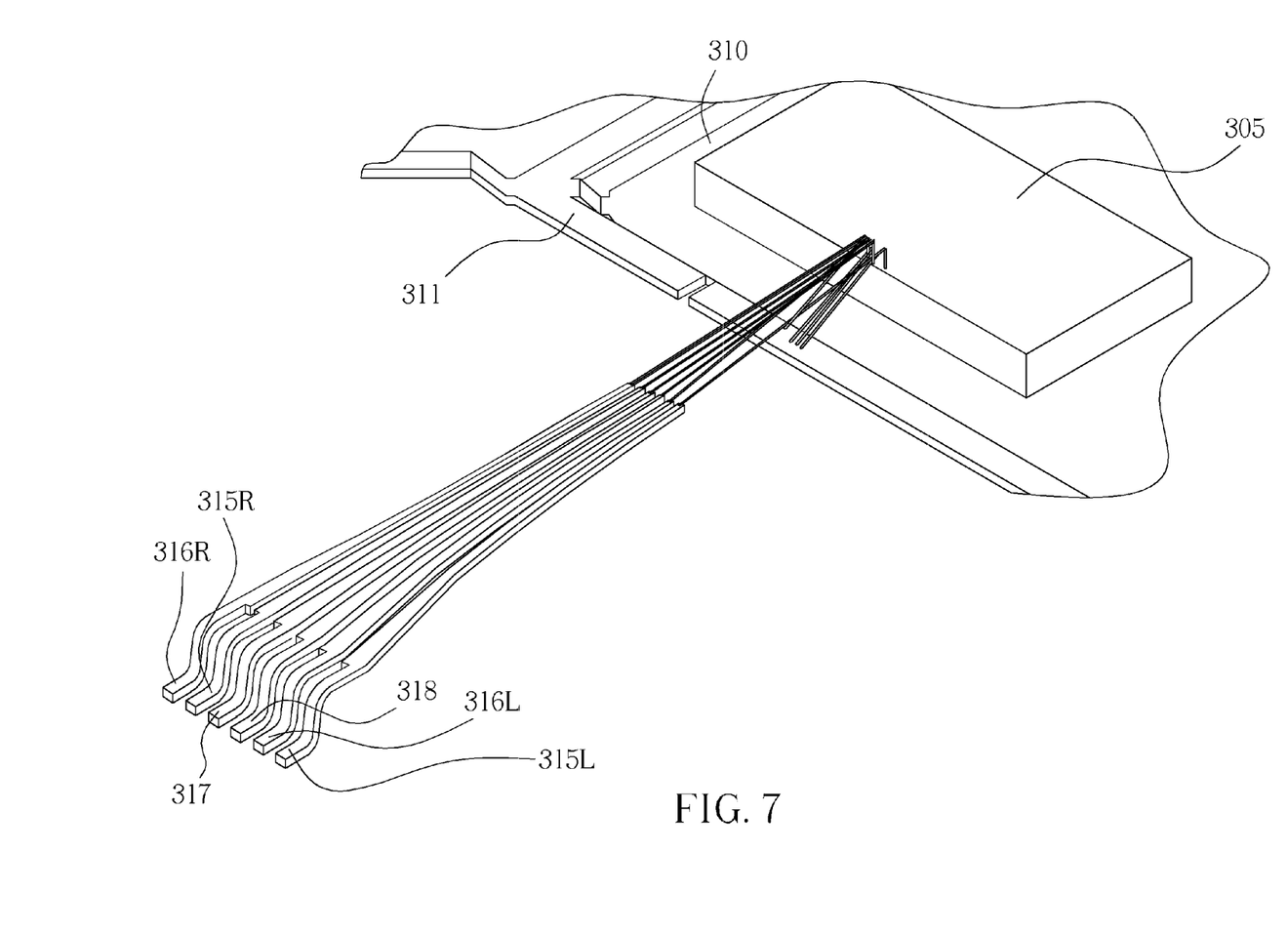
FIG. 7 is a diagram showing another embodiment with respect to the arrangement for conductive components of the semiconductor device shown in FIG. 2.

Moreover, in other embodiments, the sequence of the lead frames with respect to the LQFP as shown in FIG. 3 (or FIG. 4 and FIG. 5) can be adjusted. Please refer to FIG. 7. FIG. 7 shows that conductive components 317 and 318 (i.e. lead frames) unrelated to channel signals are disposed between a set of the conductive components 315L and 316L and a set of the conductive components 315R and 316R. Compared to the drawings of part (A) of FIG. 3-FIG. 5, the conductive components 315L and 315R (or 316L and 316R) shown in FIG. 7 are separated by more conductive components (three conductive components), and the crosstalk effect between the left and right channel signals belonging to the same multi-channel stereo signal can be decreased further. Similarly, the sequence of the traces with respect to the BGA shown in FIG. 6 can also be adjusted to obtain enhanced fielding performance.

To summarize, increasing the space between any two conductive components (or any two bond wires) corresponding to left and right channel signals of the same multi-channel stereo signal can effectively decrease the stray capacitances introduced between the conductive components (or the bond wires), so as to reduce the crosstalk effect. Additionally, when the left and right channel signals are asserted, the third signal(s) corresponding to conductive component(s) used for separating one of the above-mentioned conductive components from another is/are not asserted. The pin(s)/solder ball(s) corresponding to the third signal(s) can be coupled to the substantially fixed voltage level (e.g. the supply voltage level, the common voltage level, or the ground voltage level) so as to enhance the shielding effect. Due to reduction of the crosstalk effect, audio channel separation between the left and right channel signals can be easily achieved without additional computation Those skilled in the art will readily observe that numerous modifications and alterations of the device and method may be made while retaining the teachings of the invention.

What is claimed is:

1. A method for using a semiconductor device, the semiconductor device including at least a die carried by a substrate, a plurality of bond pads disposed on the die, a plurality of conductive components, and a plurality of bond wires respectively coupled between the plurality of bond pads and the plurality of conductive components, the plurality of bond pads respectively corresponding to a plurality of signals, the plurality of bond pads comprising a first bond pad configured for transmitting/receiving a first signal and a second bond pad configured for transmitting/receiving a second signal, the plurality of conductive components comprising a first conductive component and a second conductive component, where the first conductive component and the second conductive component are separated by at least a third conductive component of the plurality of conductive components; the first conductive component being bond-wired to the first bond pad, the second conductive component being bond-wired to the second bond pad, the method comprising:
configuring the first conductive component for transmitting/receiving the first signal and configuring the second conductive component for transmitting/receiving the second signal, wherein the first signal is asserted when the second signal is asserted, and the first and second signals are audio signals corresponding to a same multi-channel.

2. The method of claim 1, wherein the plurality of bond pads further comprise a third bond pad bond-wired to the third conductive component, and the method comprises:
configuring the third bond pad for transmitting/receiving a third signal; and
configuring the third signal to be not asserted when the first and second conductive components are respectively configured for transmitting/receiving the first and second signals that are asserted.

3. The method of claim 1, wherein the plurality of bond pads further comprise a third bond pad bond-wired to the third conductive component, and the method comprises:
configuring the third bond pad for transmitting/receiving a third signal; and
configuring the third conductive component for transmitting/receiving the third signal having a substantially fixed voltage level when the first and second conductive components are respectively configured for transmitting/receiving the first and second signals that are asserted.

4. The method of claim 3, wherein the step of configuring the third conductive component for transmitting/receiving the third signal having the substantially fixed voltage level comprises:
configuring the third conductive component for transmitting/receiving the fixed voltage level that is a ground voltage, a common voltage, or a supply voltage when the first and second conductive components are respectively configured for transmitting/receiving the first and second signals that are asserted.

5. The method of claim 1, further comprising:
configuring the first bond pad as an inner bond pad; and
configuring the second bond pad as an outer bond pad.

6. The method of claim 1, further comprising:
separating the first and second bond pads by at least a third bond pad of the plurality of bond pads; and
arranging the first, second, and third bond pads in a same tier.

7. The method of claim 1, wherein the plurality of conductive components are traces.

8. The method of claim 1, wherein the plurality of conductive components are lead frames.

9. The method of claim 1, wherein the step of configuring the first and second signals comprises:
configuring one of the first and second signals as a left channel signal, and another as a right channel signal.

10. A method for using a semiconductor device, the semiconductor device comprising at least a die carried by a substrate and a plurality of bond pads disposed on the die, the plurality of bond pads respectively corresponding to a plurality of signals, the plurality of bond pads comprising a first bond pad configured for transmitting/receiving a first signal and a second bond pad configured for transmitting/receiving a second signal, where the first bond pad and the second bond pad are separated by at least a third bond pad of the plurality of bond pads, and the method comprising:
configuring the first bond pad for transmitting/receiving the first signal and configuring the second bond pad for transmitting/receiving the second signal, wherein the first signal is asserted when the second signal is asserted; and, the first and second signals are audio signals corresponding to a same multi-channel.

11. The method of claim 10, further comprises:
configuring the third bond pad for transmitting/receiving a third signal; and
configuring the third signal to be not asserted when the first and second conductive components are respectively configured for transmitting/receiving the first and second signals that are asserted.

12. The method of claim 10, further comprising:
configuring the third bond pad for transmitting/receiving a third signal; and
configuring the third bond pad for transmitting/receiving the third signal having a substantially fixed voltage level when the first and second bond pads are respectively configured for transmitting/receiving the first and second signals that are asserted.

13. The method of claim 10, wherein the step of configuring the first and second signals as audio signals comprises:
configuring one of the first and second signals as a left channel signal, and another as a right channel signal.

14. A method for using a semiconductor device, the semiconductor device comprising at least a die carried by a substrate and a plurality of conductive components respectively corresponding to a plurality of signals, the plurality of conductive components comprising a first conductive component configured for transmitting/receiving a first signal and a second conductive component configured for transmitting/receiving a second signal, where the first conductive component and the second conductive component are separated by at least a third conductive component of the plurality of conductive components, and the method comprising:
configuring the first conductive component for transmitting/receiving the first signal and configuring the second conductive component for transmitting/receiving the second signal, wherein the first signal is asserted when the second signal is asserted, and the first and second signals are audio signals corresponding to a same multi-channel.

15. The method of claim 14, further comprising:
configuring the third conductive component for transmitting/receiving a third signal; and
configuring the third signal to be not asserted when the first and second conductive components are respectively configured for transmitting/receiving the first and second signals that are asserted.

16. The method of claim 15, further comprising:
configuring the third conductive component for transmitting/receiving a third signal; and
configuring the third conductive component for transmitting/receiving the third signal having a substantially fixed voltage level when the first and second conductive components are respectively configured for transmitting/receiving the first and second signals that are asserted.

17. The method of claim 14, wherein the plurality of conductive components are traces.

18. The method of claim 14, wherein the plurality of conductive components are lead frames.

* * * * *